(12) United States Patent
Hayashi et al.

(10) Patent No.: US 8,132,709 B2
(45) Date of Patent: Mar. 13, 2012

(54) SEMICONDUCTOR DEVICE AND METHOD FOR MANUFACTURING SAME

(75) Inventors: Tadao Hayashi, Tokushima (JP); Yoshiharu Nagae, Tokushima (JP)

(73) Assignee: Nichia Corporation, Anan-shi (JP)

( * ) Notice: Subject to any disclaimer, the term of this patent is extended or adjusted under 35 U.S.C. 154(b) by 411 days.

(21) Appl. No.: 11/939,044

(22) Filed: Nov. 13, 2007

(65) Prior Publication Data

US 2008/0116591 A1 May 22, 2008

(30) Foreign Application Priority Data

Nov. 22, 2006 (JP) ................................. 2006-315090

(51) Int. Cl.
*H01L 23/49* (2006.01)

(52) U.S. Cl. ............. 228/180.5; 257/638; 257/673; 257/735; 257/780; 257/781; 257/E23.024; 361/776; 438/611; 438/612; 438/613; 438/615; 438/617

(58) Field of Classification Search ............. 257/734, 257/738, 737, 780, 784, E23.141, 638, 673, 257/735, 781, E23.024; 438/611, 612, 613, 438/615, 617; 361/776; 228/180.5
See application file for complete search history.

(56) References Cited

U.S. PATENT DOCUMENTS

| | | | | |
|---|---|---|---|---|
| 4,824,005 A * | 4/1989 | Smith, Jr. | | 228/1.1 |
| 5,111,989 A * | 5/1992 | Holdgrafer et al. | | 228/110.1 |
| 5,186,381 A * | 2/1993 | Kim | | 228/123.1 |
| 5,198,964 A * | 3/1993 | Ito et al. | | 361/717 |
| 5,359,227 A * | 10/1994 | Liang et al. | | 257/784 |
| 5,842,628 A * | 12/1998 | Nomoto et al. | | 228/180.5 |
| 5,866,953 A * | 2/1999 | Akram et al. | | 257/790 |
| 5,960,262 A * | 9/1999 | Torres et al. | | 438/123 |
| 6,153,940 A * | 11/2000 | Zakel et al. | | 257/779 |
| 6,215,182 B1 * | 4/2001 | Ozawa et al. | | 257/723 |
| 6,495,773 B1 * | 12/2002 | Nomoto et al. | | 174/260 |
| 6,602,778 B2 * | 8/2003 | Manning et al. | | 438/617 |
| 6,778,406 B2 * | 8/2004 | Eldridge et al. | | 361/776 |
| 6,784,539 B2 * | 8/2004 | Efland | | 257/712 |
| 6,787,926 B2 * | 9/2004 | Chen et al. | | 257/784 |
| 6,815,836 B2 * | 11/2004 | Ano | | 257/784 |
| 6,847,105 B2 * | 1/2005 | Koopmans | | 257/686 |
| 6,854,637 B2 * | 2/2005 | Harun et al. | | 228/180.5 |
| 6,882,056 B2 * | 4/2005 | Komiyama et al. | | 257/777 |
| 6,982,220 B1 * | 1/2006 | Liou | | 438/617 |
| 7,019,335 B2 * | 3/2006 | Suenaga | | 257/99 |
| 7,176,570 B2 * | 2/2007 | Takahashi | | 257/737 |
| 7,188,759 B2 * | 3/2007 | Calpito et al. | | 228/180.5 |
| 7,192,861 B2 * | 3/2007 | Ano | | 438/617 |

(Continued)

FOREIGN PATENT DOCUMENTS

JP 2002-353267 A 12/2002

*Primary Examiner* — Victor A Mandala
*Assistant Examiner* — William Harriston
(74) *Attorney, Agent, or Firm* — Global IP Counselors, LLP

(57) ABSTRACT

A semiconductor device comprises a semiconductor element having electrodes, a metal member, wires that electrically connect the semiconductor element and the metal member and/or electrodes within the semiconductor element, wherein the wires constitute at least a first wire loop and a second wire loop, the first wire loop is bonded at one end to a first bonding point and at the other end to a second bonding point, and has a flat part which includes the surface of a boll part and the wire located contiguously the ball part surface, and the second wire loop connects the surface of the ball part and a third bonding point.

16 Claims, 9 Drawing Sheets

U.S. PATENT DOCUMENTS

| | | | |
|---|---|---|---|
| 7,285,854 B2 * | 10/2007 | Ishikawa et al. | 257/738 |
| 7,314,818 B2 * | 1/2008 | Takahashi et al. | 438/612 |
| 7,347,352 B2 * | 3/2008 | Qin et al. | 228/180.5 |
| 7,443,042 B2 * | 10/2008 | Bambridge et al. | 257/784 |
| 7,464,854 B2 * | 12/2008 | Babinetz | 228/180.5 |
| 7,584,881 B2 * | 9/2009 | Qin et al. | 228/180.5 |
| 7,651,022 B2 * | 1/2010 | Babinetz et al. | 228/180.5 |
| 7,821,140 B2 * | 10/2010 | Mii et al. | 257/784 |
| 2002/0089070 A1 * | 7/2002 | Manning et al. | 257/784 |
| 2002/0137327 A1 * | 9/2002 | Arakawa | 438/617 |
| 2002/0158325 A1 * | 10/2002 | Yano et al. | 257/686 |
| 2003/0166333 A1 * | 9/2003 | Takahashi | 438/617 |
| 2003/0230796 A1 * | 12/2003 | Ismail et al. | 257/686 |
| 2004/0104477 A1 * | 6/2004 | Fujisawa | 257/738 |
| 2005/0072833 A1 * | 4/2005 | Wong et al. | 228/180.5 |
| 2005/0148175 A1 * | 7/2005 | Yano et al. | 438/686 |
| 2005/0167828 A1 * | 8/2005 | Yeo et al. | 257/734 |
| 2008/0023831 A1 * | 1/2008 | Nishimura et al. | 257/737 |
| 2008/0111252 A1 * | 5/2008 | Qin et al. | 257/784 |

* cited by examiner

SEMICONDUCTOR DEVICE AND METHOD FOR MANUFACTURING SAME

BACKGROUND OF THE INVENTION

1. Field of the Invention

The present invention relates to a semiconductor device comprising semiconductor elements that are wire bonded alone or together, and to a method for manufacturing this semiconductor device.

2. Background Information

With a semiconductor device featuring semiconductor elements (chips) such as semiconductor diodes, a plurality of chips are generally mounted in a single package, and methods have been proposed for connecting these chips together by wire bonding (see Japanese Laid-Open Patent Application 2002-353267, for example). With this method, when a plurality of chips are connected by wire, first, wedge bonding is performed on a first wire from the terminal of an electrode pattern (first bonding point) to the upper electrode of a chip (second bonding point). Then, ball bonding is performed with a second wire over this wedge bonded part. The result is that the ball formed by ball bonding is connected to the upper electrode of the chip, the wire is prevented from becoming a thin film at this portion, and the wire bonding junction is strengthened.

However, when wedge bonding is performed directly on the electrode of a semiconductor element, a problem is that a stable junction cannot be obtained due to the thinness of the electrode. Furthermore, in the case of a type of semiconductor element having positive and negative electrodes on one side, the height of one of the electrode faces is lower than the height of the semiconductor element surface, so if this electrode face is subjected to the above-mentioned wedge bonding, the step surface of the semiconductor element is damaged by the distal end of the capillary.

SUMMARY OF THE INVENTION

The present invention was conceived to solve these problems, and it is an object thereof to provide a semiconductor device comprising semiconductor elements that are wire bonded between the electrodes of a single semiconductor element or between a plurality of semiconductor elements, wherein the number of wires and their length are reduced, regardless of the positions of the semiconductor element electrodes, and sufficient junction reliability can be achieved at each junction site, and a method for manufacturing this semiconductor device.

The present invention provides a semiconductor device comprising a semiconductor element having electrodes, a metal member, wires that electrically connect the semiconductor element and the metal member and/or electrodes within the semiconductor element, wherein the wires constitute at least a first wire loop and a second wire loop, the first wire loop is bonded at one end to a first bonding point and at the other end to a second bonding point, and has a flat part which includes the surface of a boll part and the wire located contiguously the ball part surface, and the second wire loop connects the surface of the ball part and a third bonding point.

Further, the present invention provides a method for manufacturing a semiconductor device as the above, comprising the steps of:

(a) compression bonding a ball formed by the melting of the wire to the first bonding point, then further compression bonding another part of the wire extending from the ball onto the ball, drawing the wire toward the second bonding point, and bonding it to the second bonding point; and (b) wire bonding the third bonding point and the first bonding point.

With the semiconductor device of the present invention, the number of wires and their length can be reduced, regardless of the positions of the semiconductor element electrodes in a semiconductor device comprising semiconductor elements that are wire bonded between the electrodes of a single semiconductor element or between a plurality of semiconductor elements, and also sufficient junction reliability can be achieved at each junction site. As a result, problems caused by wire degradation, contact/short-circuiting of the wire, and so forth can be kept to a minimum, high reliability and performance can be achieved, and a semiconductor device with a longer service life can be obtained.

Further, with the method of the present invention for manufacturing a semiconductor device, the above-mentioned semiconductor device can be manufactured effectively by a simple method.

DETAILED DESCRIPTION OF THE PREFERRED EMBODIMENTS

Figure 1:
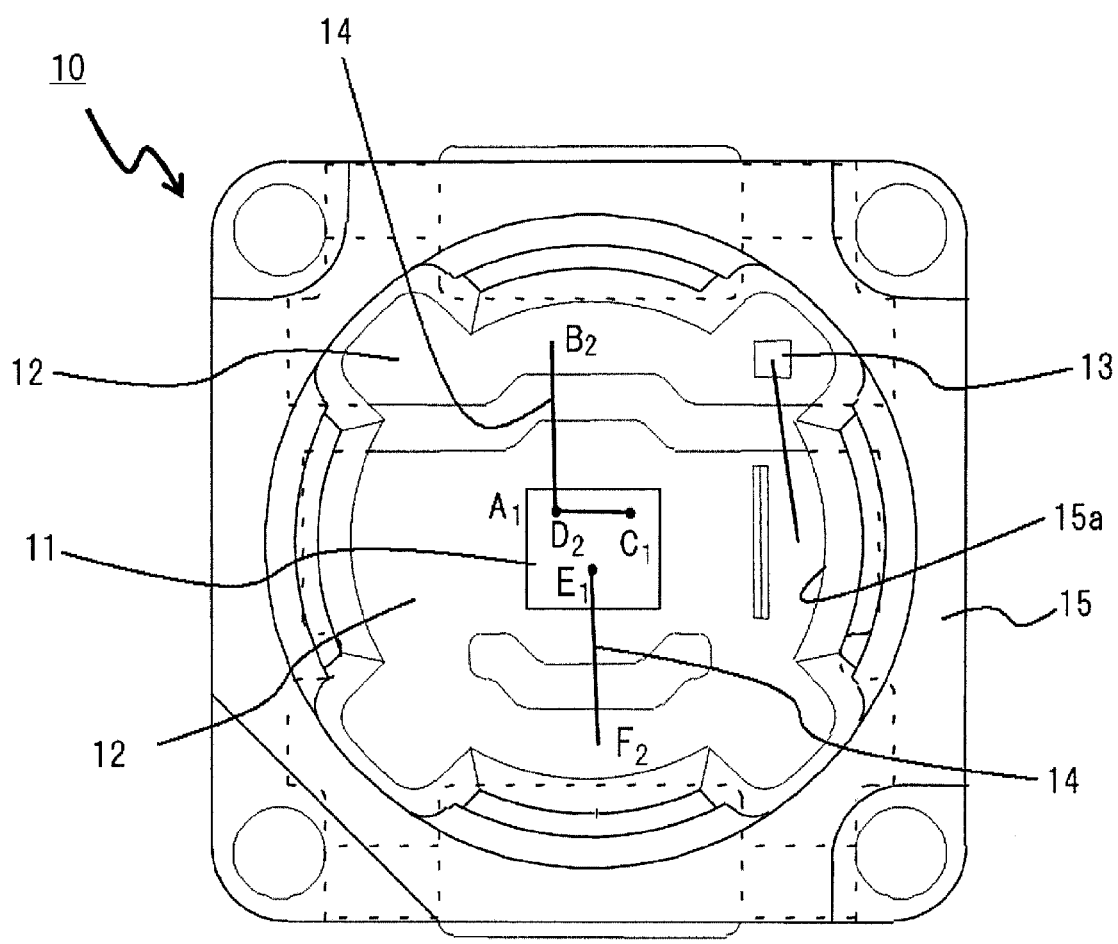
FIG. 1 is a simplified plan view of the main components in the semiconductor device of the present invention.

The semiconductor device of the present invention includes at least semiconductor elements and wires, and usually the wires connect semiconductor elements together, or connect metal members and semiconductor elements.

The semiconductor device of the present invention can be utilized, by mounting a semiconductor element, in illumination device which is using for image-reading device within facsimile machine, copy machine, hand scanner and the like, as well as in illumination light sources, backlight light sources for LED display, mobile phone and the like, signals, illumination switches, vehicle lamps, various sensors, various indicators, and various other types of illuminating apparatus.

Also, the method of manufacturing for semiconductor device of the present invention can be utilized in wire bonding for various semiconductor devices such as IC, memories and the like.

Semiconductor Elements

There are no particular restrictions on the semiconductor elements used in the present invention, so long as they are made of a semiconductor, but examples include for example, various kinds of transistors, switching transistor, Zener diode, variable-capacitance transistor, semiconductor light emitting elements and the like. Particularly, it includes a laminated structure that contains a semiconductor layer above a substrate, which is made of nitride semiconductors such as InN, AlN, GaN, InGaN, AlGaN and InGaAlN, and compound semiconductors of a group III-V elements, II-VI elements, and the like.

The semiconductor elements used in the present invention may be a type in which positive and negative electrodes are formed on opposite sides, or the positive and negative electrodes may be formed on the same side to a substrate. The pair of electrodes in the latter case may be disposed at the same height (substantially the same distance from the semiconductor layer), or one electrode may be higher than the other. If one is higher than the other, then wedge bonding directly to the electrodes will result in a poor junction state, and damage to the die will be caused by capillary contact, and therefore the effect of the present invention will be more pronounced. Also, the positive and negative electrodes in this case need not be formed as just one each, and two or more of each may be formed. That is, a total of three or more electrodes may be formed on the same side. In particular, when the semiconductor device of the present invention is made up of a single semiconductor element, two or more of each of the positive and negative electrodes may be formed on the same side of the semiconductor layer. This allows the above-mentioned effect of the present invention to be manifested to even better result.

There are no particular restrictions on the material, thickness, or structure of the electrodes, but forming them from gold is preferable from the standpoint of reliability, and depending on the type of wire (discussed below). Also, the electrodes may have either a laminated structure or a single-layer structure including gold, copper, lead, aluminum, or an alloy thereof. Also, a single-layer film or laminated film of nickel, titanium, gold, platinum, tungsten, or another such metal or alloy may be formed as a pad electrode on the surface of each electrode. There are no particular restrictions on the thickness of the pad electrode, but it is particularly favorable for gold to be disposed as the final layer (the outermost side), and for the thickness thereof to be about 100 nm or greater.

The semiconductor elements are mounted on metal members (discussed below), and a joining material is used for this purpose. For instance, in the case of semiconductor elements having the positive and negative electrodes formed on the same side to the substrate, the back side which is not formed electrodes may be die bonded by an epoxy resin, silicone, or the like. When degradation due to light or heat from the semiconductor elements is taken into account, the back side of the semiconductor elements may be plated with aluminum, a solder such as eutectic Au—Sn, or a brazing material such as a low-melting point metal may be used as the joining material. In the case of a semiconductor element with electrodes formed on both sides, die bonding may be performed using a conductive paste made of silver, gold, palladium, or the like.

The semiconductor device of the present invention may comprise just one semiconductor element as described above, or a plurality of them may be mounted. There are no particular restrictions on the wiring pattern, but it may be selected from among various wiring patterns, such as serial, parallel, or combination thereof.

Metal Members

A metal member serves as a substrate for mounting the semiconductor elements and the electrodes that electrically connect with the semiconductor elements, and may be substantially in the form of a plate, or may be in the form of a sheet that is textured or undulating. The thickness thereof may be uniform, or the member may be thick in some parts and thin in others. There are no particular restrictions on the material, but forming the metal members from a material with a relatively high thermal conductivity, for example, a material that has a thermal conductivity of about 200 W/(m·K) or higher, or one with a relatively high mechanical strength, or one that lends itself well to punching, etching, or other such working. Forming from such a material allows the heat generated by the semiconductor elements to escape more efficiently. More specifically, examples include copper, aluminum, gold, silver, tungsten, iron, nickel, and other such metals, and alloys such as iron-nickel or phosphor bronze. Also, the surface of the metal members is preferably given a reflective plating so that the light from the mounted semiconductor elements can be taken off more efficiently.

Usually, two or more metal members are provided to a single semiconductor device, and it is good for their to be one more metal member than there are semiconductor elements. In addition to having a region in which a semiconductor element is mounted and which is connected to a semiconductor element, a metal member may have a region extending as a lead terminal connecting with an external component. The lead terminal can be suitably bent or deformed according to mounting type of the semiconductor device (i.e., side view type, top view type, or the like) of the present invention and how it will be used.

Wires

A wire is a conductive member that is used to electrically connect (i.e., bond) a metal member to an electrode formed on the surface of a semiconductor element, or to connect semiconductor elements together, or to connect the electrodes within a semiconductor element, etc. In particular, when semiconductor elements are connected together, it is preferable for like-pole electrodes of the semiconductor elements to be connected.

The semiconductor elements are mounted in a partial region of the metal member. This partial region is disposed so as to be exposed from the package within a concave opening formed in the package surface. The electrical connection of the semiconductor elements to the metal member in this partial region can be accomplished by wire bonding to the metal member using wires. The wire preferably has good ohmic characteristics with the electrodes of the electrode of the semiconductor elements, or has good mechanical connection characteristics, or has good electrical conductivity and thermal conductivity. The thermal conductivity is preferably about 0.01 cal/S·cm$^{2\cdot\circ}$ C./cm or higher, and about 0.5 cal/S·cm$^{2\cdot\circ}$ C./cm or higher is even better. When ease of work and so forth are taken into account, the diameter of the wire is preferably about 10 to 45 μm. Examples of this wire include gold, copper, platinum, aluminum, and other such metals and alloys thereof. Among these, it is preferably gold from the view of reliability of the wire bonding, stress relaxation after the wire bonding, and the like.

With the semiconductor device of the present invention, "first wire loop" refers to a wire loop that connects a first bonding point and a second bonding point. The second wire loop connects the first bonding point and a third bonding point. The second wire loop connects the upper face of the ball part of the first wire loop, and another bonding point (regardless of whether or not there is a ball part there), but may connect two semiconductor elements together, and a plurality of components corresponding to this second wire loop may be formed in a single semiconductor device.

With the present invention, the point the is first joined as the starting point in wire bonding (wire loop) between two points may be called the first bonding point, and the point that is then joined as the end point is sometimes called the second bonding point. In this case, at the first bonding point block or ball formed by melting a wire is usually bonded on an electrode of a semiconductor element or a metal member. The connected portion of a wire that has thus undergone ball bonding is sometimes called a ball part. Also, when a wire is connected at the second bonding point, the wire is connected without a ball being formed by the melting of the wire. The connected portion of the wire at this second bonding point is sometimes called a wedge bonded part. Therefore, "bonding point" usually refers to a partial region of a metal member surface constituting the semiconductor device, or that of an electrode surface of a semiconductor element, but as discussed below, when a plurality of wire loops are formed, this term encompasses the bonded region, such as on the wire or the ball part.

With the semiconductor device of the present invention, the second bonding point (or wedge bonded part) is preferably disposed directly over a metal member so as to be in contact with the metal member. Also, when the second bonding point (or wedge bonded part) is disposed over an electrode of a semiconductor element, it is preferably disposed via at least a ball part (discussed below), and a wedge bonded part (discussed below) is preferably not directly connected so as to be in contact with the electrode of the semiconductor element.

Usually, even if a pad electrode has been formed on the surface of a semiconductor element electrode, (1) it is relatively thin (the thickness of the electrode or of the electrode plus the pad electrode), making a stable junction difficult to achieve, (2) the semiconductor element is damaged if ultrasonic waves are applied to strengthen the joint, or the ultrasonic energy is increased, and (3) if there is a large difference in height between the first bonding point and second bonding point, this can result in more pronounced damage to the semiconductor element.

Because of the above, with the semiconductor device of the present invention, even when the first metal member or electrode is thin, and particularly the electrode is thin, a compression bonded ball serves well as a pad electrode, affording a stable junction. Also, even if ultrasonic waves are applied to strengthen the joint, or if there is a large difference in height between the first bonding point and second bonding point, damage to the semiconductor element can still be avoided.

There are no particular restrictions on the wire bonding method used to accomplish this wire connection, but thermo-compression wire bonding, ultrasound combined with thermo-compression wire bonding, or the like can usually be used to advantage.

In a wire bonding method, first (a) a ball formed by melting a wire is compression bonded to the first bonding point, another part of the wire extending from this compression bonded ball is compression bonded over the compression bonded ball, and the above-mentioned wire is drawn toward the second bonding point and connected to this second bonding point To carry out this step (a), a wire is threaded into a capillary or other jig, and a spark or other high-temperature medium is utilized to produce a ball by melting the distal end of the wire. There are no particular restrictions on the temperature, which can be adjusted as dictated by the material, thickness, and so on of the wire being used. For example, this temperature may be about 360° C. or lower. There are no particular restrictions on the size of the ball, but usually it has a diameter about 2 to 20 times, and preferably about 2 to 10 times, that of the wire.

This ball is then compression bonded to a metal member or electrode surface. In the present invention, as discussed above, this compression bonding point is the first bonding point. The load here can be suitably adjusted, taking into account the spread in the diameter of the ball on the metal member or electrode surface. Compression bonding may also be combined with ultrasonic action.

Then, the capillary is moved in the opposite direction to draw the wire in the opposite direction from that point that will be the end point (that is, the second bonding point). The "opposite direction" in this case encompasses a range of about 150 to 210° with respect to the second bonding point. The amount of drawing here, that is, how far the capillary is moved, is favorably about 10 to 100 μm.

After this, the capillary is optionally raised and moved directly over the ball, then lowered to compression bond the capillary on the ball, and another part of the wire extending from the compression bonded ball is compression bonded over the compression bonded ball. As a result, the ball surface and the surface of the wire located nearby can be made substantially flat. In other words, a flat part which includes the surface of a boll part and the wire located contiguously the ball part surface can be formed by the wire at this step. In this case, the compression bonding may be combined with ultrasonic action, but compression bonding is preferably performed without any ultrasound. This is because ultrasonic action can finally crush the wire, and this can lead to diminished junction reliability. Also, compression bonding another part of the wire over the compression bonded ball reduces the upward elongation of the wire (how much space it occupies), and allows this elongation to be kept to a height of about 1.0 to 5.0 times the wire diameter from the bottom face of the compression bonded ball, or, put another way, to be kept to no more than about 1 to 3 times the height of the compression bonded ball.

The wire is then drawn from directly over the compression bonded ball to the second bonding point, and joined at the second bonding point. The joining in this case can be accomplished either with or without ultrasonic action.

After step (a), (b) wire bonding is performed between a third bonding point and the first bonding point. Further, after step (b), there may be a step (c) of wire bonding between a fourth bonding point and the first bonding point. Also, step (b) may be such that after the ball formed by melting the wire has been compression bonded to the first bonding point, another part of the wire extending from this ball is compression bonded over this ball, and the wire is drawn toward the third bonding point and bonded to the third bonding point. This step is substantially the same as step (a), except that the positions of the first bonding point and second bonding point are different.

With the semiconductor device of the present invention, the series of steps from the production of the ball to the joining to the second bonding point is carried out two or more times between any two different points, but is preferably carried out three, four, or more times according to the number of semiconductor elements that are mounted, the configuration of the electrodes of the semiconductor elements, the connection configuration of the semiconductor elements, and so forth. From another standpoint, the first bonding point and/or second bonding point is preferably set to a total of three or more points per semiconductor element, and preferably each of these is set to two or more points. In this case, the two or more first bonding points and second bonding points may be formed at the same points. That is, (1) one or more wires (wedge bonded parts) may be connected directly or indirectly at the second bonding point over the wire (ball part) at the first bonding point, or (2) one or more wires may be connected at the first bonding point over the wire at the first bonding point. In the case of (1), furthermore, one or more wires may be connected at the first and/or second bonding point over the wire at the second bonding point connected over the wire of the first bonding point, and in the case of (2), one or more wires may be connected at the second bonding point over the wire at any first bonding point.

Thus, one or more layers of wire (that is, ball part and/or wedge bonded part) are formed via a wire (that is, a ball part) at the first bonding point on the electrode surface of a semiconductor element, the result being that the lowermost layer of the ball part functions as a base for a metal member or electrode surface (and particularly an electrode surface), so improper junction in wire bonding, damage to the semiconductor element, and so forth can be effectively prevented.

To accomplish this, one or more wires may be connected at the first and/or second bonding point to the compression bonded ball formed on a metal member surface or electrode surface between the above-mentioned steps (a) and (b).

A protective element other than the above semiconductor elements may also be mounted in the semiconductor device of the present invention. There may be just one protective element, or there may be two or more. There are no particular restrictions on the protective element, and any known type that is mounted in semiconductor devices may be used. Specific examples include elements that protect against overheating, over-voltage, over-current, and static electricity, and circuit protection elements, that is, Zener diode, diode of a transistor, or the like.

Also, with the semiconductor device of the present invention, the semiconductor elements, metal members, wires, and so forth are preferably molded or sealed by a resin, integrally or in a block form. This resin may be formed from any material, as long as it ensures insulation to the semiconductor elements and so on. Specific examples of which include polyphthalamide (PPA), polycarbonate resin, polyphenylene sulfide (PPS), liquid crystal polymer (LCP), ABS resin, epoxy resin, phenol resin, acrylic resin, PBT resin, and other such resins, ceramics and glass. In particular, when the semiconductor device of the present invention is a light emitting element, it is preferably to use a translucent resin as the above resin. Various kinds of dye, pigment, or the like may also be mixed into these materials as colorants or light diffusers. Examples of colorants include $Cr_2O_3$, $MnO_2$, $Fe_2O_3$, and carbon black.

In the present invention, the term "translucent" means that the material transmits at least about 70%, and preferably at least about 80%, and more preferably at least about 90%, and even more preferably at least about 95%, of the light emitted from the semiconductor element.

There are no particular restrictions on the size and shape of the molding/sealing resin, but it may, for example, be in the form of a circular cylinder, an elliptical cylinder, a sphere, an egg, a triangular cylinder, a quadrangular cylinder, a polyhedral cylinder, a shape similar to these, or the like. It may also be formed with an integral lens for focusing.

The molding/sealing resin may contain a diffuser or a fluorescent substance. A diffuser is an agent that diffuses light, and serves to lessen directionality from the semiconductor element (particularly, light emitting element) and to widen the viewing angle. A fluorescent substance is one that converts light from the semiconductor element, and is able to convert the wavelength of light emitted from the semiconductor element to the outside of the molding/sealing resin. If the light from the semiconductor element is visible light with a short wavelength and high energy, then it is preferable to use an inorganic phosphorescent material such as ZnCdS:Cu, YAG:Ce, or nitrogen-containing $CaO-Al_2O_3-SiO_2$ that has been activated with europium and/or chromium, or a perylene derivative, which is an organic phosphorescent material.

Furthermore, the semiconductor device of the present invention may be equipped with a lens or the like made of plastic or glass, as part of the semiconductor device or as an addition to the sealing resin surface, such as at the part of the semiconductor element (and particularly a light emitting element) where the light exits (above a light emitting element, for example). It may also be equipped with a reflective member, an antireflective member, a light scattering member, or any of various other components so that light can be taken off more efficiently from the semiconductor element.

In addition, the semiconductor device may be formed as a surface mount type of semiconductor device (SMD), in which a semiconductor element or sealing resin is disposed in a recess of a package having a bottom face and walls that surround the semiconductor element. The package may be formed from any material, as long as it protects the semiconductor element, sealing resin, etc. Especially favorable, though, is a material that is electrically insulating and that blocks light, such as a ceramic or a milky white resin. Also, when adhesion to the sealing resin and so forth due to the effect of the heat produced by the semiconductor element, etc., is taken into account, the package material is preferably selected from among those with a similar coefficient of thermal expansion. The bottom face and walls of the package may be made of a material that is continuous between the substrate and metal member, or part of the metal member may be exposed to form an electrical connection or a heat dispersal path. A reflective material that reflects light from the semiconductor element may be provided inside the package, and the package may be formed in a reflector shape for focusing light.

Examples of the semiconductor device of the present invention will now be described in detail through reference to the drawings.

Example 1

As shown in FIG. 1, the semiconductor device 10 of this Example comprises a semiconductor element 11, sheet-form metal members 12, wires 14 that electrically connect the semiconductor element 11 and the metal members 12 as well as electrodes within the semiconductor element 11, and a sealing resin 15 for integrally sealing all these components. A protective element 13 that is electrically connected to the metal members 12 is further mounted on the semiconductor device 10, on the inside of the sealing resin 15.

The metal members 12 are sheets of an aluminum alloy, and comprise a region in which the semiconductor element is mounted, and a region extending from this in one direction.

The sealing resin 15 is molded integrally in a shape that is nearly rectangular parallelepiped (10×5×1 mm), sandwiching part of the metal members 12. Near the middle of this molded article is a semiconductor window 15a that is substantially circular (3 mm diameter). In the semiconductor window 15a part of the metal members 12 is exposed, and the semiconductor element 11 is mounted on the exposed metal member 12. A translucent resin (not shown) fills in the semiconductor window 15a.

The semiconductor element 11 has three electrodes (not shown) formed on its surface, and these electrodes are electrically connected to a metal member 12 or another electrode by a wire 14.

Figure 2A:
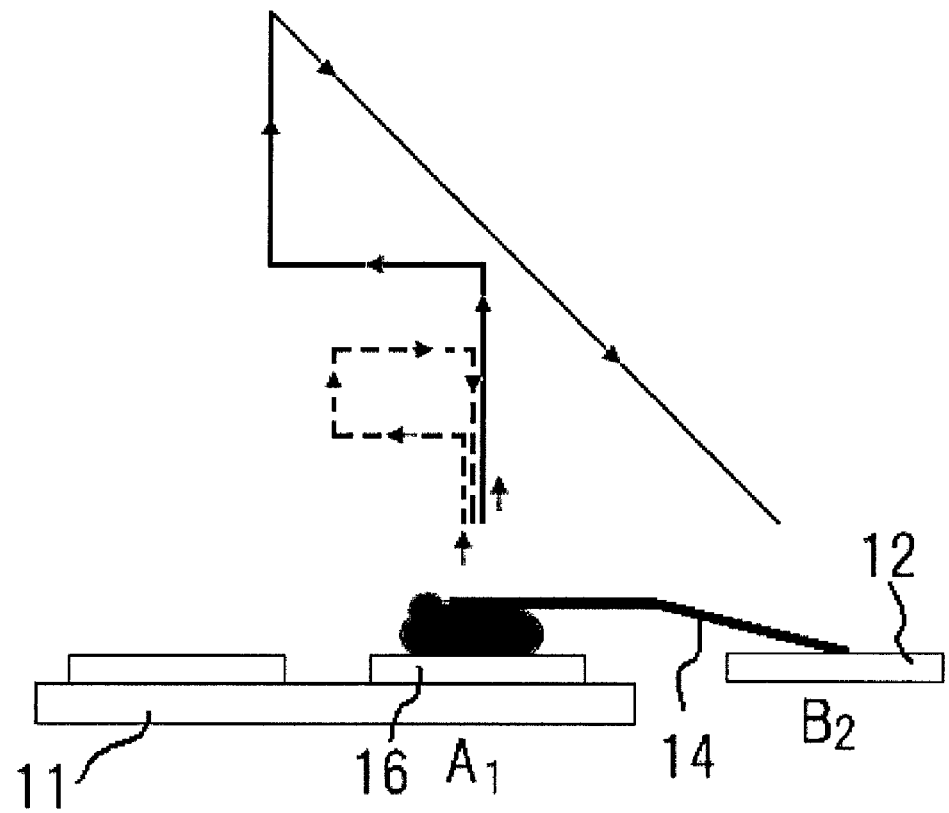
FIGS. 2a to 2b are simplified cross sections illustrating the method for wire bonding a semiconductor device of the present invention.

The wires 14 are joined by wire bonding to a metal member surface or electrode surface. As shown in FIG. 2a, a ball formed by melting a wire 14 is compression bonded to the surface of an electrode 16 of the semiconductor element 11 (first bonding point $A_1$), and another part of the wire extending from this compression bonded ball is further compression bonded onto the compression bonded ball (ball part), extended in the direction of the metal member 12 (second bonding point $B_2$), and joined to the surface of the metal member 12 (wedge bonded part). In other words, at the first bonding point $A_1$, a loop is formed from the wire on the opposite side from the second bonding point $B_2$, and the compression bonded ball surface/top portion thereof is in a crushed state including part of the wire, and has a relatively flattened shape.

In the joining of this wire, first, the wire 14 is threaded through a capillary (not shown) and a spark or other high-temperature medium is utilized to produce a ball by melting the distal end of the wire. This ball is then compression bonded and joined to the surface of the electrode 16. This compression bonding point shall be called the first bonding point $A_1$. Next, the capillary is raised from the compression bonding point as indicated by the dashed line arrows in FIG. 2a, and the capillary is moved horizontally in the opposite direction to play out the wire 14 and draw it in the opposite direction from the second bonding point $B_2$.

After this, the capillary is raised and moved directly over the ball to play out the wire 14, and the capillary is pressed over the ball, causing another part of the wire extending from the compression bonded ball to be further compression bonded over the compression bonded ball, and causing the ball surface and the surface of the wire located nearby to become substantially flat. The capillary is then raised as indicated by the solid line arrows in FIG. 2a to play out the wire 14, moved horizontally in the opposite direction from the second bonding point $B_2$ and raised again to play out the wire 14, passes directly over the compression bonded ball, and moves horizontally and descends to the second bonding point $B_2$ while drawing the wire 14 and joining it to the second bonding point.

Also, with this semiconductor device, wire bonding is performed between this electrode 16 and another electrode 17 over the first bonding point $A_1$ of the electrode 16. In this wire joining, the series of steps discussed above is carried out, so that as shown in FIG. 2b, the surface of the first bonding point $C_1$ is given a flattened shape just as with the ball part discussed above. Also, the second bonding point $D_2$ is the surface of the electrode 16 over the semiconductor element 11, but since a compression bonded ball has already been formed as the first bonding point $A_1$ (ball part), and this compression bonded ball has a flat shape, this second bonding point $D_2$ serves to protect the electrode 16, such as a pad electrode, and allows wire joining of the second bonding point.

Thus, as shown in FIG. 1, with this semiconductor device 10, the wire bonding of the semiconductor element 11 is performed three times, for $A_1$-$B_2$, $C_1$-$D_2$, and $E_1$-$F_2$, and there are four bonding points on the surface of the semiconductor element 11. One of these has a structure in which the second bonding point is set over the first bonding point and wire bonding is performed so that the two are in contact, and no wedge bonded part is disposed/formed directly for the electrodes of the semiconductor element 11.

This ensures a good junction state for all of the joints, and wire bonding can be performed simply, without any special steps being added, by a simple change consisting of merely changing the movement of the capillary. Furthermore, the length of the wire itself can be shortened, so that there is no extra wire above the wire bonding site, and even if wire bonding is performed again over a wire bonded site, there will be no problems associated with the height of the bonded portion. In addition, since wire bonding can be performed again over a wire bonded site, a plurality of junctions by wire bonding can be organized to reduce the number of junctions.

Thus, contact between wires, deterioration of the wires, and so forth can be kept to a minimum, which ensures good reliability and allows a semiconductor device with a longer service life to be obtained. This also enhances productivity. Furthermore, because the number and length of the wires are reduced, the region and space needed to ensure insulation around the wires can be reduced, which allows the semiconductor device to be smaller.

Figure 3A:
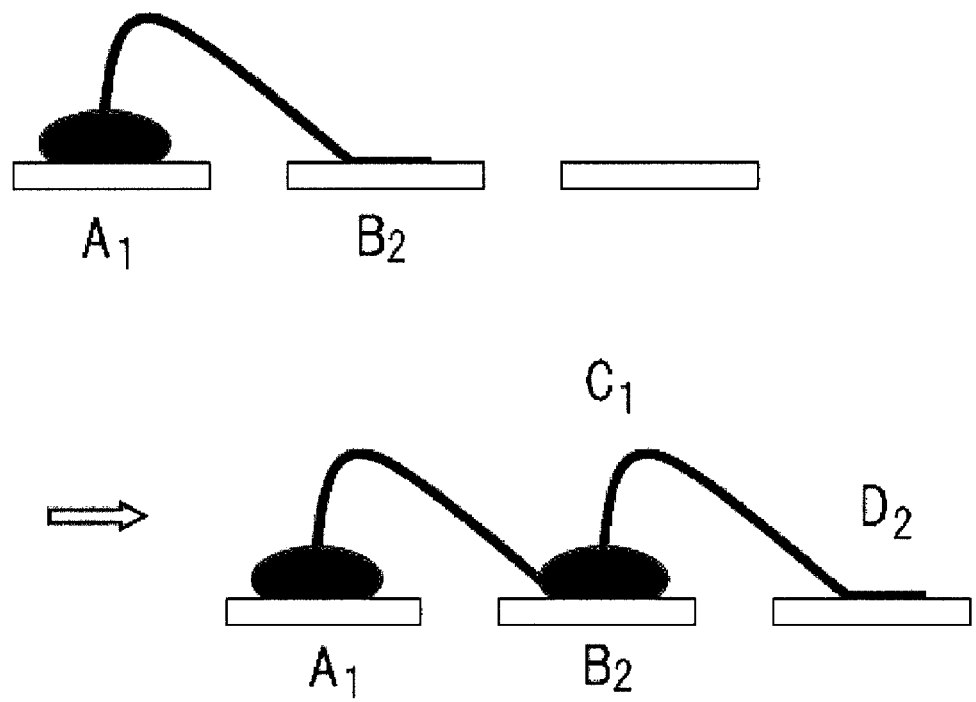
FIGS. 3a to 3b are simplified cross sections illustrating the comparative method for wire bonding a semiconductor device.

For the sake of comparison, wire bonding was performed by a conventional method in which another part of the wire was further compression bonded to the compression bonded ball and no flattening was performed. In this case, since the second bonding point could not be disposed over the first bonding point, as shown in FIG. 3a, the first bonding point was disposed over the second bonding point and successive wire bonding was performed. As a result, because the second bonding point was disposed directly on the surface of the semiconductor element, stable joining was impossible due to the thinness of the electrode, and furthermore the semiconductor element was damage around the electrode.

Figure 3B:
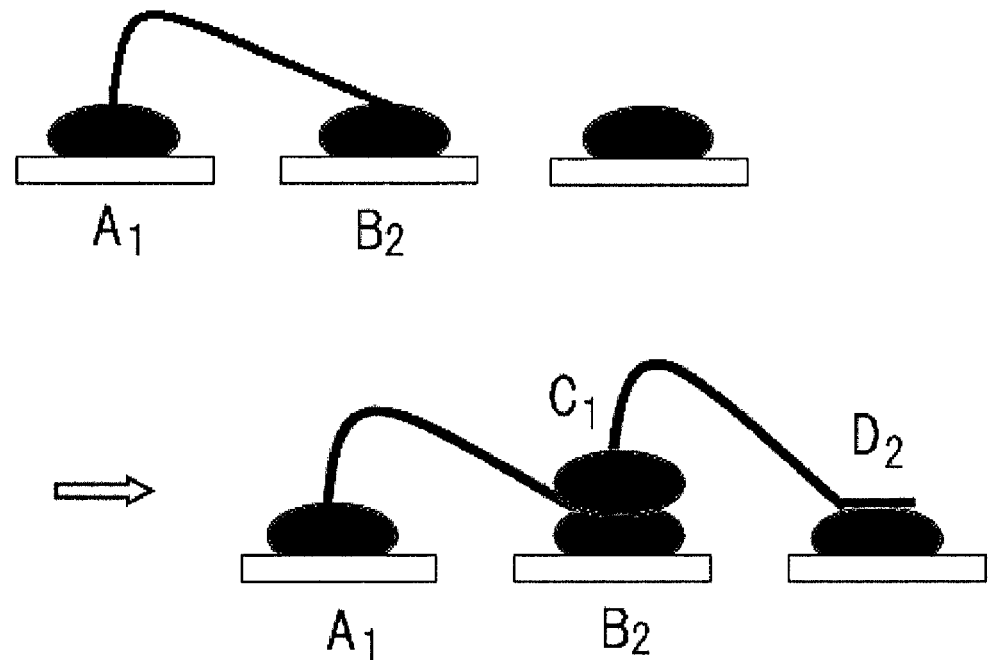

Also, as shown in FIG. 3b, a bump electrode of a specific thickness was formed ahead of time on the electrode surface of a semiconductor element, and wire bonding was performed using the bump electrode as the second bonding point. As a result, a good junction could be obtained in the first wire bonding, but since the wire ball was compression bonded at the first bonding point over the bump electrode the second and subsequent times, there was an increase in the overall height, the joining state was seen to be inconsistent, and a good junction could not be ensured. Also, the first bonding point and the second bonding point can not be connected over the first bonding point since the ball surface is not made flat.

Example 2

Figure 4:
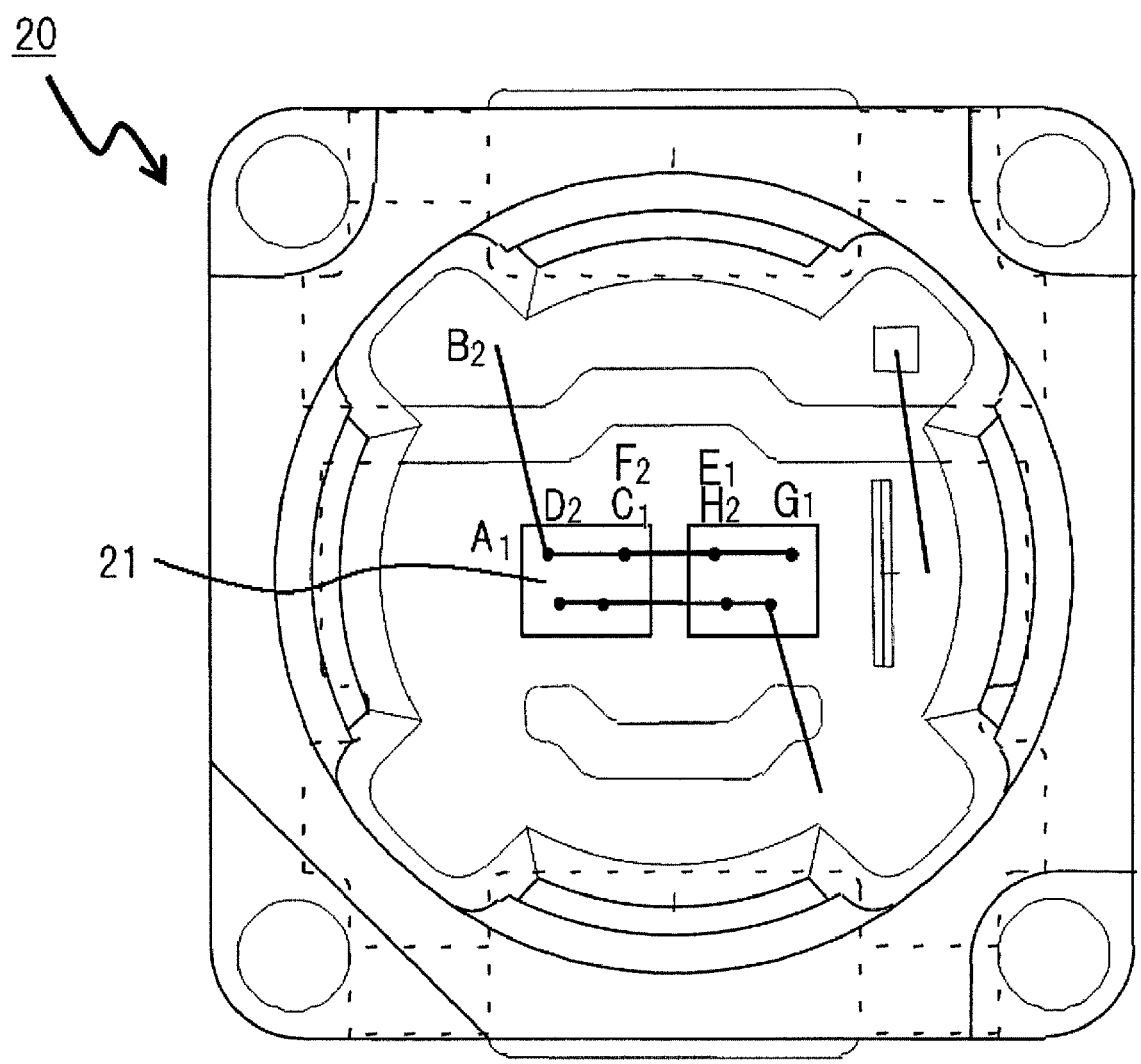
FIG. 4 is a simplified plan view of the main components in another semiconductor device of the present invention.

As shown in FIG. 4, the semiconductor device 20 of this Example had substantially the same structure as that in Example 1, except that two semiconductor elements 21 were mounted, on the surface of which were formed four electrodes, and the first bonding point and second bonding point were set to $A_1$-$H_2$ . . . according to $A_1$-$D_2$ in Example 1. The parts of the structure that were the same will not be described again (the same applies to the following Examples).

Figure 2B:
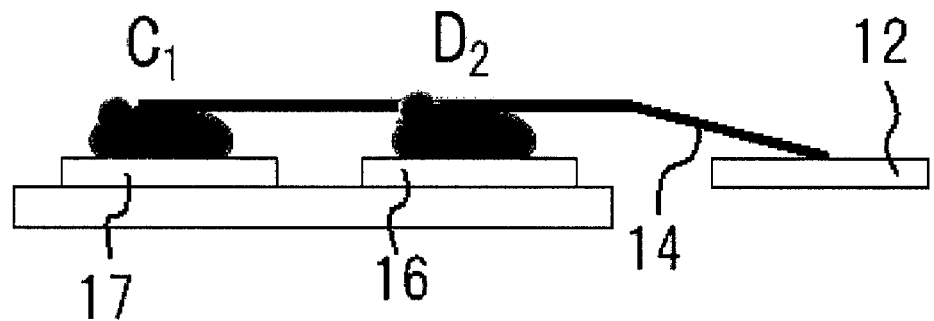

With this semiconductor device 20, just as in Example 1, and as shown in FIG. 2b, the second bonding point was disposed, and a wire connected, over a compression bonded ball (ball part) to which part of the wire of the first bonding point had been compression bonded. This had the same effect as in Example 1.

Also, wiring to metal members did not need to be performed for four n electrodes or four p electrodes of the two semiconductor elements, and the n electrodes could be linked consecutively, so the length of the wire could be shortened considerably. Furthermore, since no space was taken up by extra wire above the semiconductor elements, the wires could be prevented from touching each other, and a more compact size could be achieved.

Example 3

Figure 5:
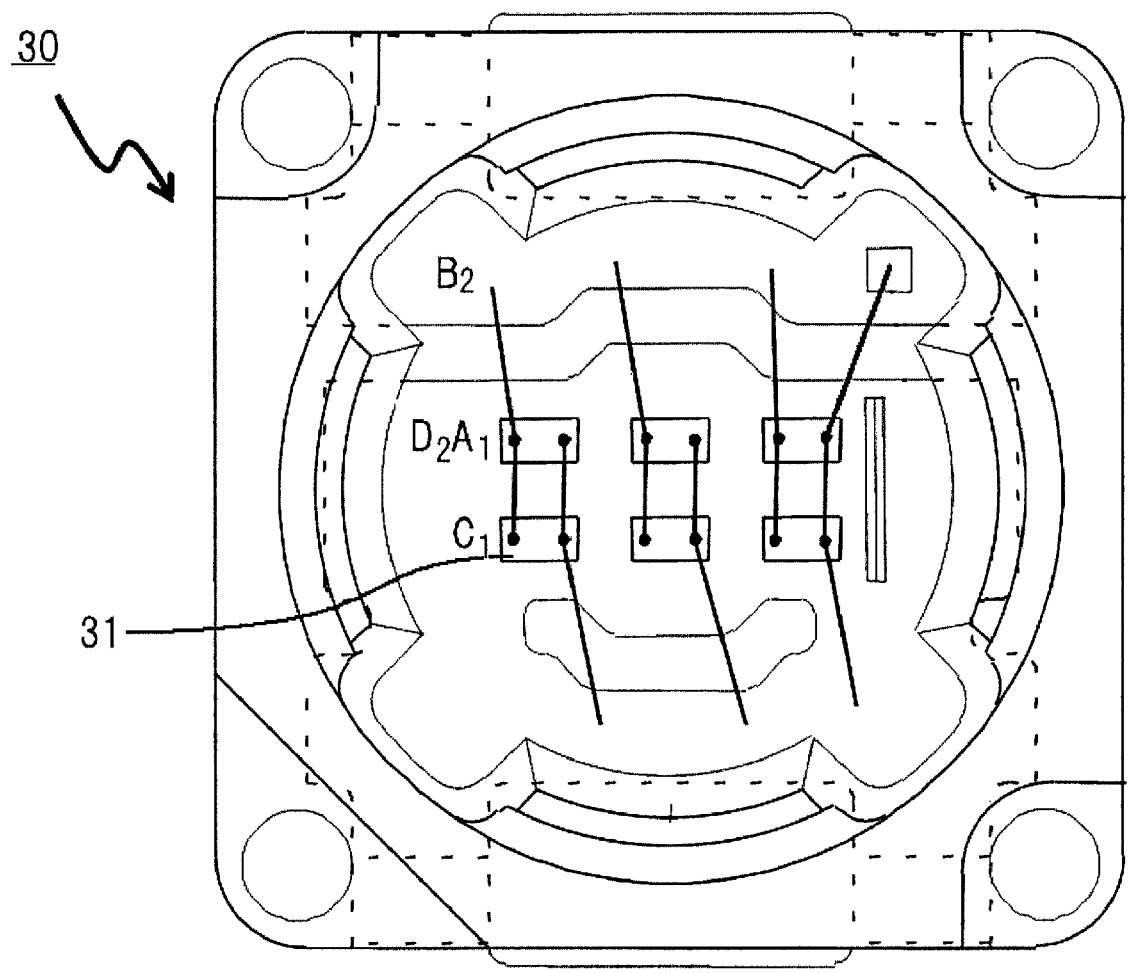
FIG. 5 is a simplified plan view of the main components in still another semiconductor device of the present invention.

As shown in FIG. 5, the semiconductor device 30 of this Example had substantially the same structure as that in Example 1, except that six semiconductor elements 31 were mounted, on the surface of which were formed two electrodes, and the first bonding point and second bonding point were set to $A_1$-$D_2$ . . . according to $A_1$-$D_2$ in Example 1.

With this semiconductor device 30, just as in Example 1, and as shown in FIG. 2b, a wire connected. This had the same effect as in Example 1 and Example 2.

Example 4

Figure 6:
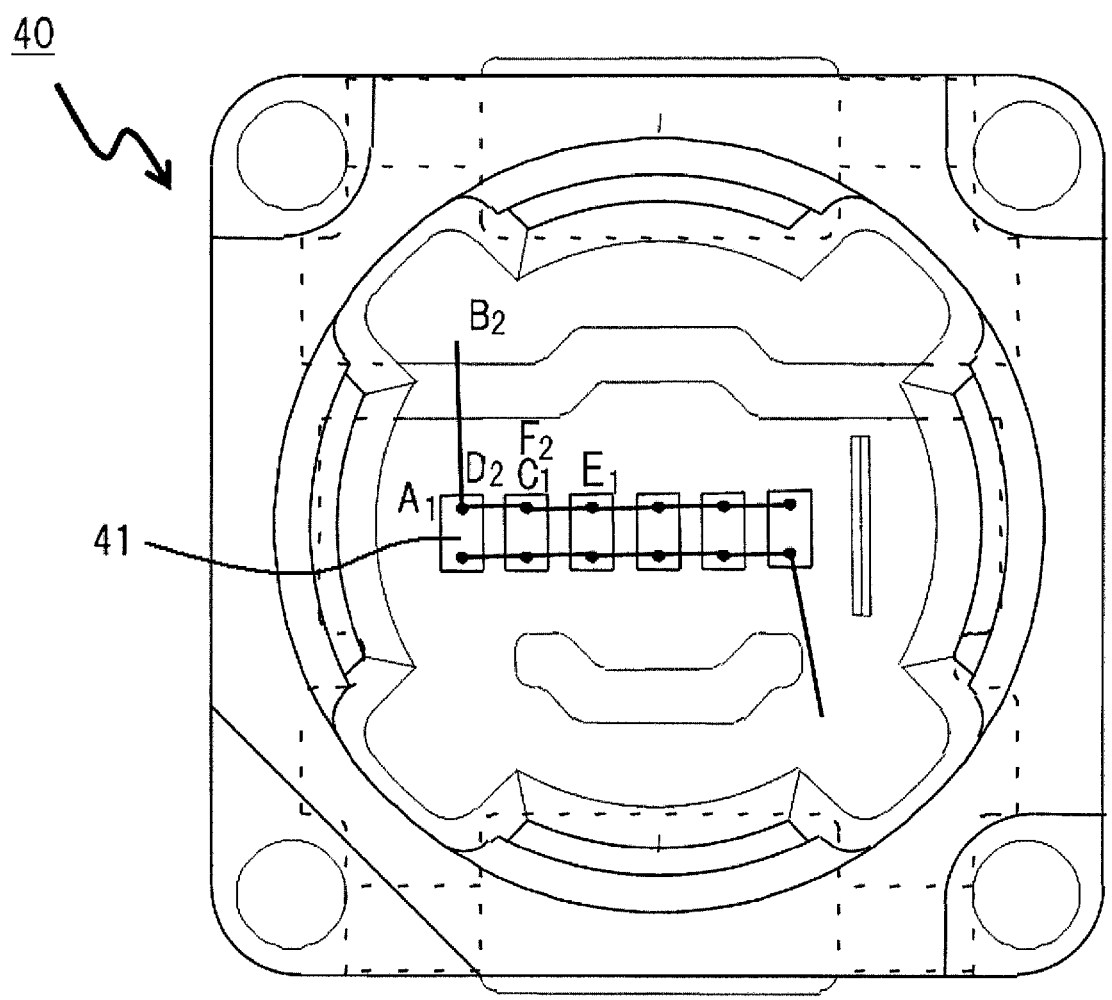
FIG. 6 is a simplified plan view of the main components in still another semiconductor device of the present invention.

As shown in FIG. 6, the semiconductor device 40 of this Example had substantially the same structure as that in Example 1, except that six semiconductor elements 41 were mounted, on the surface of which were formed two electrodes, and the first bonding point and second bonding point were set to $A_1$-$F_2$ . . . according to $A_1$-$D_2$ in Example 1.

With this semiconductor device 40, just as in Example 1, and as shown in FIG. 2b, a wire connected. This had the same effect as in Example 1 and Example 2.

Example 5

Figure 7:
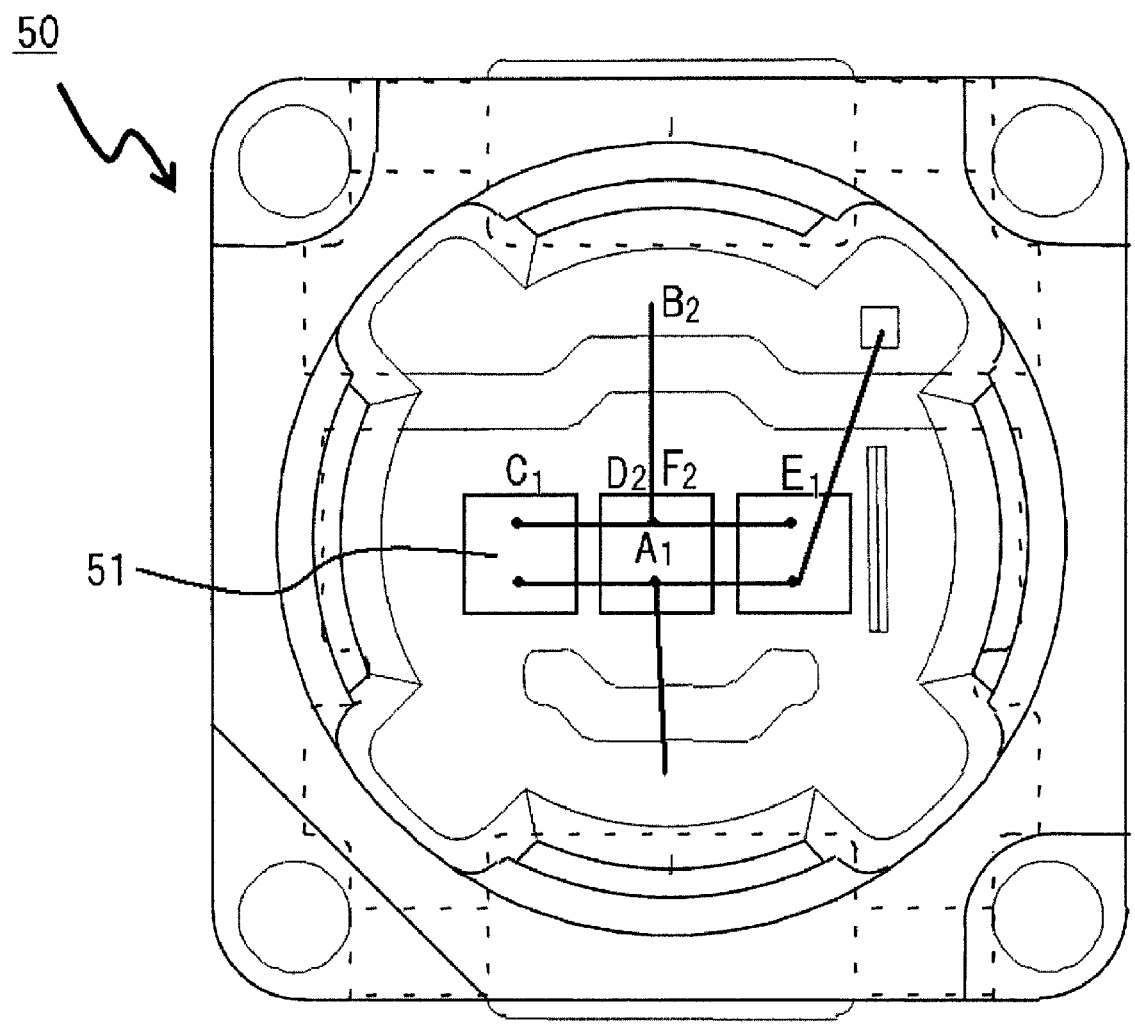
FIG. 7 is a simplified plan view of the main components in the semiconductor device of the present invention.

As shown in FIG. 7, the semiconductor device 50 of this Example had substantially the same structure as that in Example 1, except that three semiconductor elements 51 were mounted, on the surface of which were formed two electrodes, and the first bonding point and second bonding point were set to $A_1$-$F_2$ . . . according to $A_1$-$D_2$ in Example 1.

With this semiconductor device 50, just as in Example 1, and as shown in FIG. 2b, the second bonding point was disposed, and a wire connected, over a compression bonded ball (ball part) to which part of the wire of the first bonding point had been compression bonded, and although not shown in the drawings, the wire (wedge bonded part) of the second bonding point was further connected over the wire (wedge bonded part) of the second bonding point over this ball part (see points $A_1$, $D_2$, and $F_2$ in FIG. 7). This had the same effect as in Example 1 and Example 2.

Figure 8:
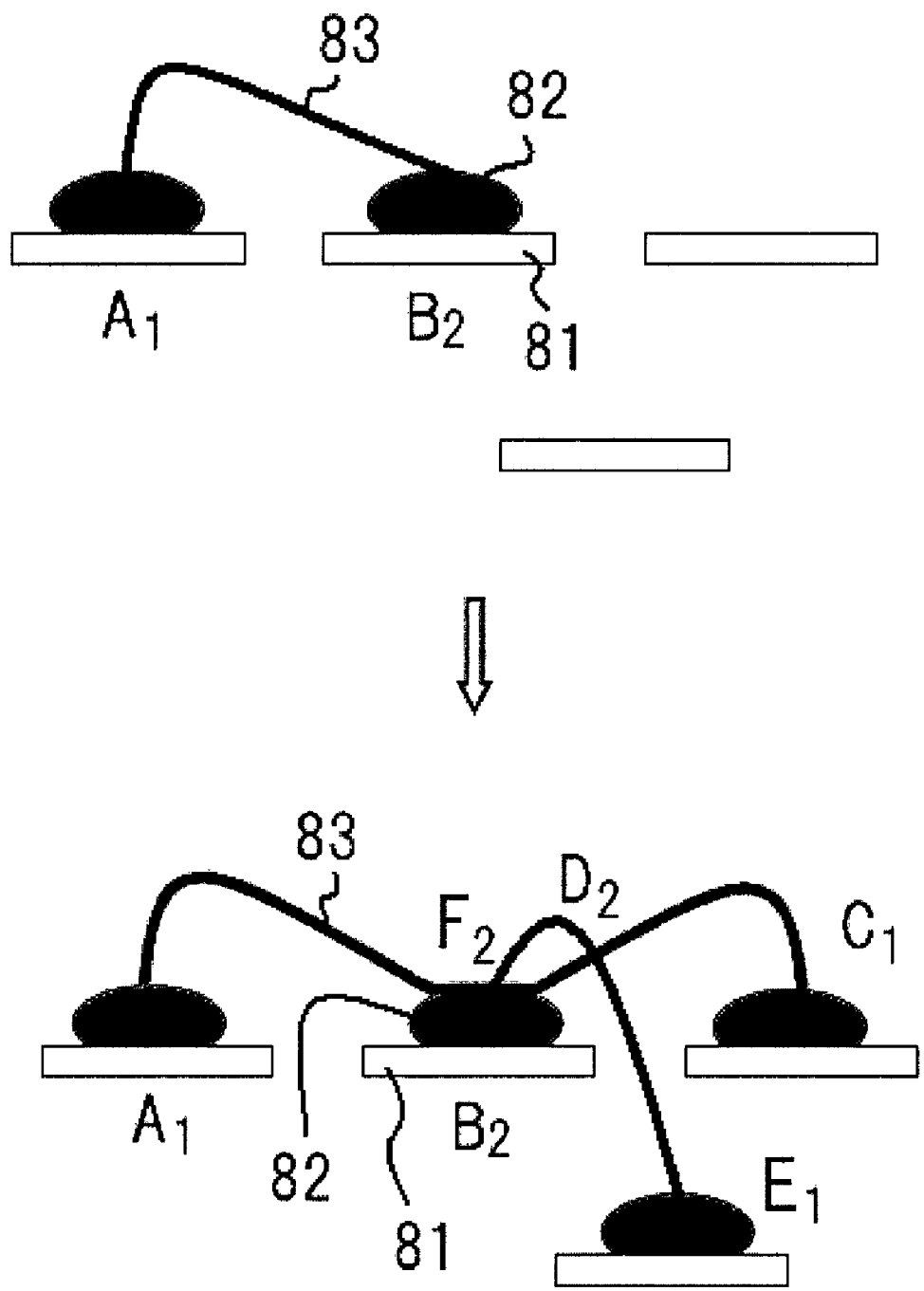
FIG. 8 is a simplified cross section illustrating another comparative method for wire bonding a semiconductor device.

For the sake of comparison, as shown in FIG. 8, a pad electrode 82 was formed ahead of time in the region of an electrode 81 of the semiconductor element that would become the second bonding point, over which three wires 83 of the second bonding point were connected ($A_1$-$B_2$, $C_1$-$D_2$, and $E_1$-$F_2$, in that order). As a result, comparatively good connections were still obtained when two wires of the second bonding point were connected ($D_2$), but when the third wire of the second bonding point was connected ($F_2$), the wires were stacked up so high above the pad electrode that productivity suffered markedly, and a stable junction could not be obtained.

Example 6

Figure 9A:
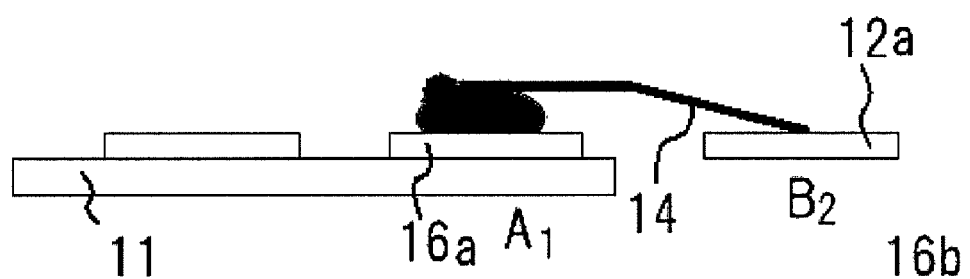
FIGS. 9a to 9b are simplified cross sections illustrating the another method for wire bonding a semiconductor device of the present invention.
Figure 9B:
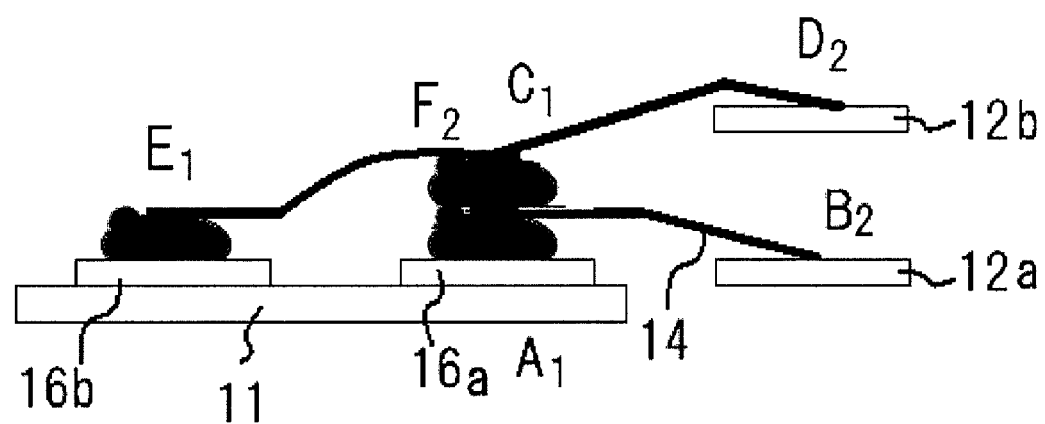

With the semiconductor device of this Example, as shown in FIG. 9a, wire bonding was performed between a metal member 12a and an electrode 16a of the semiconductor element 11, that is, between the first bonding point $A_1$ and the second bonding point $B_2$, and then, as shown in FIG. 9b, other wire bonding was performed between another metal member 12b and the same electrode 16a of the same semiconductor element 11, that is, between the first bonding point $C_1$ and the second bonding point $D_2$. Therefore, two layers of compression bonded ball were stacked at the first bonding points $A_1$ and $C_1$. Further, still other wire bonding was performed between another electrode 16b (first bonding point $E_1$) and the electrode 16a (second bonding point $F_2$), the result being that a wire was connected by second bonding to the surface of a compression bonded ball with a two-layer structure. This had the same effect as in Example 1 and Example 2.

This application claims priority to Japanese Patent Application No. 2006-315090. The entire disclosure of Japanese Patent Application No. 2006-315090 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device comprising
a semiconductor element having electrodes, a metal member, wires that electrically connect the semiconductor element and the metal member, and/or electrodes within the semiconductor element,
wherein the wires constitute at least a first wire loop and a second wire loop,
the first wire loop is bonded at one end to a first bonding point by ball bonding and at the other end to a second bonding point, the first wire loop having a flat part formed at the first bonding point by flattening a part of a ball part and a loop of the wire drawn from the ball part toward an opposite side of the second bonding point, and
the second wire loop is bonded at one end to a third bonding point by ball compression bonding and at the other end to the flat part of the first wire loop at the first bonding point, the wire bonding at the third bonding point and at a flat part of the first wire loop at the first bonding point being compression bonded, a second ball formed by the melting of the wire at the third bonding point, a loop of the wire drawn from the second ball toward an opposite direction of the first bonding point with the loop extending from the second ball over and onto the second ball and being further compression bonded to the second ball, the wire being drawn toward the first bonding point, and bonded to the first bonding point.

2. The semiconductor device according to claim 1, wherein the first, second and third bonding points located on the electrodes provided to the semiconductor element surface and/or the metal member.

3. The semiconductor device according to claim 1, wherein the second wire loop connects a plurality of semiconductor elements.

4. The semiconductor device according to claim 1, wherein the second wire loop connects a plurality of like-pole electrodes provided to a semiconductor element surface.

5. The semiconductor device according to claim 1, wherein the second wire loop has a ball part on the ball part of the first wire loop, and a surface of the ball part is in a flat state including a part of the wire.

6. The semiconductor device according to claim 1, wherein the surface of the ball part of the first wire loop is connected to a third wire loop connecting with a fourth bonding point.

7. A method for manufacturing a semiconductor device having a semiconductor element having electrodes, a metal member, wires that electrically connect the semiconductor element and the metal member and/or electrodes within the semiconductor element, the wires constituting at least a first wire loop and a second wire loop, the first wire loop being bonded at one end to a first bonding point and at the other end to a second bonding point, and having a flat part which includes the surface of a ball part and the wire located contiguously the ball part surface, and the second wire loop connecting the surface of the ball part and a third bonding point, comprising the steps of:

(a) compression bonding a ball formed by the melting of the wire to the first bonding point, forming a loop of the wire by drawing the wire from the ball toward an opposite direction of the second bonding point, further compression bonding the loop of the wire extending from the ball onto the ball to flatten a part of the ball, drawing the wire toward the second bonding point, and bonding it to the second bonding point; and (b) wire bonding the third bonding point and a flat part of the first wire loop at the first bonding point by compression bonding a ball formed by the melting of the wire to the third bonding point, forming a loop of the wire by drawing the wire from the ball toward an opposite direction of the first bonding point, further compression bonding the loop of the wire extending from the ball onto the ball, drawing the wire toward the first bonding point, and bonding it to the first bonding point.

8. The method according to claim 7, further comprising (c) wire bonding a forth bonding point and the first bonding point, after step (b).

9. The method according to claim 7, the step of (b) is performed by compression bonding a ball formed by the melting of the wire to the first bonding point, then further compression bonding another part of the wire extending from the ball onto the ball, drawing the wire toward the third bonding point, and bonding it to the third bonding point.

10. The semiconductor device according to claim 1, wherein the wires have a thermal conductivity of about 0.01 cal/S·cm$^{2 \cdot \circ}$ C./cm or higher.

11. The semiconductor device according to claim 1, wherein the wires have a diameter of about 10 μm to about 45 μm.

12. The semiconductor device according to claim 1, wherein an upward elongation of the first or second wire loop has a height of about 1.0 to 5.0 times a diameter of the wires from a bottom face of the ball part.

13. The semiconductor device according to claim 1, wherein a total number of the first bonding point and/or the second bonding point within the semiconductor element is at least three.

14. The method according to claim 7, wherein the step of (a) is performed by
forming the ball by melting a distal end of the wire threaded through a capillary and compression bonding the ball to the first bonding point,
forming the loop of the wire by moving the capillary upwardly from the first bonding point, moving the capillary horizontally toward the opposite direction of the second bonding point, moving the capillary upwardly, then moving the capillary back to a position above the first bonding point,
compression bonding the loop of the wire by moving the capillary downwardly onto the ball, and
drawing the wire toward the second bonding point by moving the capillary upwardly from the first bonding point, moving the capillary horizontally toward the opposite direction from the second bonding point, moving the capillary upwardly again, then moving the capillary horizontally and downwardly toward the second bonding point while the capillary passes over the ball at the first bonding point.

15. The method according to claim 7, wherein in the step of (a), the opposite direction is in a range of about 150° to about 210° with respect to the second bonding point.

16. A method for manufacturing a semiconductor device having a semiconductor element having electrodes, a metal member, wires that electrically connect the semiconductor element and the metal member and/or electrodes within the semiconductor element, the wires constituting at least a first wire loop and a second wire loop, the first wire loop being bonded at one end to a first bonding point and at the other end to a second bonding point, and having a flat part which includes the surface of a ball part and the wire located contiguously the ball part surface, and the second wire loop connecting the surface of the ball part and a third bonding point, comprising the steps of:

(a) compression bonding a ball formed by the melting of the wire to the first bonding point, forming a loop of the wire by drawing the wire from the ball toward an opposite direction of the second bonding point, further compression bonding the loop of the wire extending from the ball onto the ball to flatten a part of the ball, drawing the wire toward the second bonding point, and bonding it to the second bonding point; and (b) wire bonding the third bonding point and a flat part of the first wire loop at the first bonding point by compression bonding a ball formed by the melting of the wire to the first bonding point, then further compression bonding another part of the wire extending from the ball onto the ball, drawing the wire toward the third bonding point, and bonding it to the third bonding point.

* * * * *